(12) United States Patent
Chen et al.

(10) Patent No.: US 9,236,253 B2
(45) Date of Patent: Jan. 12, 2016

(54) STRAINED STRUCTURE OF A SEMICONDUCTOR DEVICE

(71) Applicant: Taiwan Semiconductor Manufacturing Company, Ltd., Hsin-Chu (TW)

(72) Inventors: Chung-Hsien Chen, Taipei (TW);
Ting-Chu Ko, Hsin-Chu (TW);
Chih-Hao Chang, Chu-Bei (TW);
Chih-Sheng Chang, Hsin-Chu (TW);
Shou-Zen Chang, Panchiao (TW);
Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/166,585

(22) Filed: Jan. 28, 2014

(65) Prior Publication Data
US 2014/0147978 A1    May 29, 2014

Related U.S. Application Data

(62) Division of application No. 13/588,860, filed on Aug. 17, 2012, now abandoned.

(51) Int. Cl.
*H01L 29/66* (2006.01)
*H01L 21/02* (2006.01)
(Continued)

(52) U.S. Cl.
CPC .... *H01L 21/02664* (2013.01); *H01L 21/28518* (2013.01); *H01L 21/823807* (2013.01); *H01L 21/823814* (2013.01); *H01L 29/665* (2013.01);
(Continued)

(58) Field of Classification Search
None
See application file for complete search history.

(56) References Cited

U.S. PATENT DOCUMENTS 4,873,205 A * 10/1989 Critchlow et al. ............ 438/647
5,695,810 A    12/1997 Dubin et al.
(Continued)

FOREIGN PATENT DOCUMENTS

KR    100810776    12/2006
KR    100835521    6/2008

OTHER PUBLICATIONS

Pan, J. et al., "Novel Approach to Reduce Source/Drain Series Resistance in High Performance CMOS Devices Using Self-Aligned CoWP Processes for 45nm Node UTSOI Transistors with 20nm Gate Length," 2006 Symposium on VLSI Technology, Digest of Technical Papers, 2006, pp. 184-185, IEEE.

*Primary Examiner* — Benjamin Sandvik
(74) *Attorney, Agent, or Firm* — Slater & Matsil, L.L.P.

(57) ABSTRACT

A semiconductor device comprises a substrate comprising a major surface; a p-type Field Effect Transistor (pFET) comprising: a P-gate stack over the major surface, a P-strained region in the substrate adjacent to one side of the P-gate stack, wherein a lattice constant of the P-strained region is different from a lattice constant of the substrate, wherein the P-strained region has a first top surface higher than the major surface; and a P-silicide region on the P-strained region; and an n-type Field Effect Transistor (nFET) comprising: an N-gate stack over the major surface, an N-strained region in the substrate adjacent to one side of the N-gate stack, wherein a lattice constant of the N-strained region is different from a lattice constant of the substrate, wherein the N-strained region has a second top surface lower than the major surface and a N-silicide region on the N-strained region.

19 Claims, 12 Drawing Sheets

(51) Int. Cl.
*H01L 21/8238* (2006.01)
*H01L 29/78* (2006.01)
*H01L 21/285* (2006.01)
*H01L 29/165* (2006.01)
*H01L 21/768* (2006.01)

(52) U.S. Cl.
CPC ...... *H01L 29/66636* (2013.01); *H01L 29/7845* (2013.01); *H01L 29/7848* (2013.01); *H01L 21/0262* (2013.01); *H01L 21/02529* (2013.01); *H01L 21/02532* (2013.01); *H01L 21/02576* (2013.01); *H01L 21/02579* (2013.01); *H01L 21/76814* (2013.01); *H01L 29/165* (2013.01)

(56) References Cited

U.S. PATENT DOCUMENTS

| | | | |
|---|---|---|---|
| 5,801,098 A | 9/1998 | Fiordalice et al. | |
| 5,907,188 A | 5/1999 | Nakajima et al. | |
| 5,942,799 A | 8/1999 | Danek et al. | |
| 5,958,508 A | 9/1999 | Adetutu et al. | |
| 5,968,333 A | 10/1999 | Nogami et al. | |
| 5,985,762 A | 11/1999 | Geffken et al. | |
| 5,990,008 A | 11/1999 | Koyama et al. | |
| 6,001,415 A | 12/1999 | Nogami et al. | |
| 6,054,382 A | 4/2000 | Hsu et al. | |
| 6,084,279 A | 7/2000 | Nguyen et al. | |
| 6,181,012 B1 | 1/2001 | Edelstein et al. | |
| 6,194,310 B1 | 2/2001 | Hsu et al. | |
| 6,291,332 B1 | 9/2001 | Yu et al. | |
| 6,544,900 B2 | 4/2003 | Raaijmakers et al. | |
| 6,602,785 B1 | 8/2003 | Sharan et al. | |
| 6,642,119 B1 * | 11/2003 | Pelella et al. | 438/303 |
| 6,657,249 B2 | 12/2003 | Nishioka et al. | |
| 6,713,835 B1 | 3/2004 | Horak et al. | |
| 6,797,608 B1 | 9/2004 | Lin | |
| 6,800,517 B2 | 10/2004 | Sandhu et al. | |
| 6,828,683 B2 | 12/2004 | Li et al. | |
| 6,969,675 B2 | 11/2005 | Lin | |
| 7,279,118 B2 | 10/2007 | Li et al. | |
| 7,799,682 B2 * | 9/2010 | Beyer et al. | 438/683 |
| 7,897,514 B2 | 3/2011 | Liu et al. | |
| 2005/0130454 A1 | 6/2005 | Murthy et al. | |
| 2005/0250301 A1 * | 11/2005 | Cabral et al. | 438/606 |
| 2006/0163670 A1 * | 7/2006 | Ellis-Monaghan et al. | 257/388 |
| 2007/0018252 A1 * | 1/2007 | Zhu | 257/369 |
| 2007/0128786 A1 | 6/2007 | Cheng et al. | |
| 2007/0269970 A1 * | 11/2007 | Purtell et al. | 438/581 |
| 2008/0157220 A1 | 7/2008 | Joo | |
| 2008/0185617 A1 * | 8/2008 | Kuan et al. | 257/288 |
| 2009/0227079 A1 * | 9/2009 | Iinuma | 438/233 |
| 2010/0289086 A1 | 11/2010 | Yu et al. | |
| 2011/0263092 A1 * | 10/2011 | Cheng et al. | 438/300 |
| 2012/0205728 A1 * | 8/2012 | Yin et al. | 257/288 |
| 2012/0235244 A1 * | 9/2012 | Yin et al. | 257/368 |
| 2014/0306290 A1 * | 10/2014 | Alptekin et al. | 257/369 |

* cited by examiner

STRAINED STRUCTURE OF A SEMICONDUCTOR DEVICE

PRIORITY CLAIM AND CROSS-REFERENCE

This application is a divisional of U.S. patent application Ser. No. 13/588,860, filed Aug. 17, 2012, which is incorporated herein by reference in its entirety.

BACKGROUND

The disclosure relates to integrated circuit fabrication, and more particularly to a semiconductor device with a strained structure.

When a semiconductor device, such as a metal-oxide-semiconductor field-effect transistor (MOSFET), is scaled down through various technology nodes, a high-k gate dielectric layer and metal gate electrode layer are incorporated into the gate stack of the MOSFET to improve device performance with the decreased feature sizes. In addition, strained structures in source and drain (S/D) recess cavities of the MOSFET utilizing selectively grown silicon germanium (SiGe) may be used to enhance carrier mobility.

However, there are challenges to implement such features and processes in complementary metal-oxide-semiconductor (CMOS) fabrication. For example, it is difficult to achieve enhanced carrier mobility for a field-effect transistor (FET) because strained materials cannot deliver a given amount of strain into channel region of the FET, thereby increasing the likelihood of device instability and/or device failure. As the gate length and spacing between devices decrease, these problems are exacerbated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DETAILED DESCRIPTION

Figure 1:
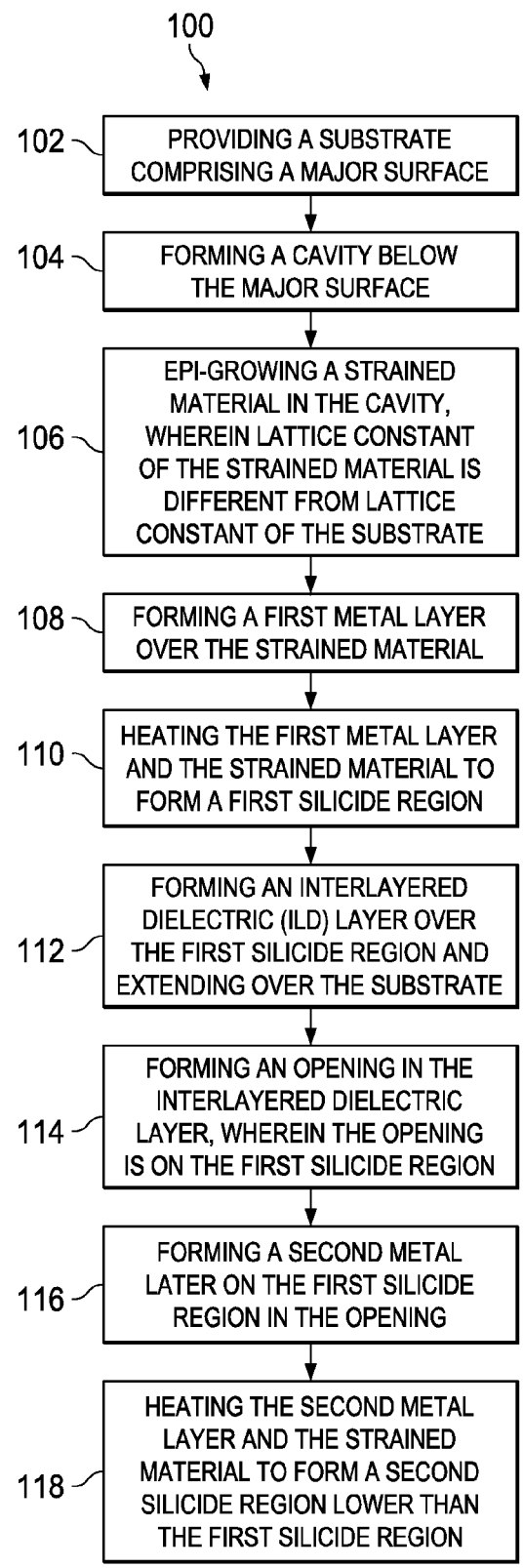
FIG. 1 is a flowchart illustrating a method of fabricating a strained structure of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a strained structure of a semiconductor device according to various aspects of the present disclosure. The method 100 begins with step 102 in which a substrate comprising a major surface is provided. The method 100 continues with step 104 in which a cavity is formed below the major surface. The method 100 continues with step 106 in which a strained material is epi-grown in the cavity, wherein a lattice constant of the strained material is different from a lattice constant of the substrate. The method 100 continues with step 108 in which a first metal layer is formed over the strained material. The method 100 continues with step 110 in which the first metal layer and the strained material are heated to form a first silicide region. The method 100 continues with step 112 in which an interlayer dielectric (ILD) layer is formed over the first silicide region and extending over the substrate. The method 100 continues with step 114 in which an opening is formed in the ILD layer, wherein the opening is on the first silicide region (i.e. the opening at least partially exposes the first silicide region). The method 100 continues with step 116 in which a second metal layer is formed on the first silicide region in the opening. The method 100 continues with step 118 in which the second metal layer and the strained material are heated to form a second silicide region lower than the first silicide region. The discussion that follows illustrates embodiments of semiconductor devices that can be fabricated according to the method 100 of FIG. 1.

FIGS. 2-12 show schematic cross-sectional views of a semiconductor device 200 comprising a strained structure 250 (see FIG. 12) at various stages of fabrication according to various aspects of the present disclosure. As employed in the present disclosure, the term semiconductor device 200 refers to a planar field effect transistor (FET). Alternatively, the term semiconductor device 200 refers to a fin field effect transistor (FinFET). The FinFET refers to any fin-based, multi-gate transistor. Other transistor structures and analogous structures are within the contemplated scope of this disclosure. The semiconductor device 200 may be included in a microprocessor, memory cell, and/or other integrated circuit (IC). It is noted that the method of FIG. 1 does not produce a completed semiconductor device 200. Completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 2 through 12 are simplified for a better understanding of the concepts of the present disclosure. For example, although only the semiconductor device 200 is depicted in FIGS. 2-12, it is understood the IC may comprise a number of other devices comprising resistors, capacitors, inductors, fuses, etc.

Figure 2:
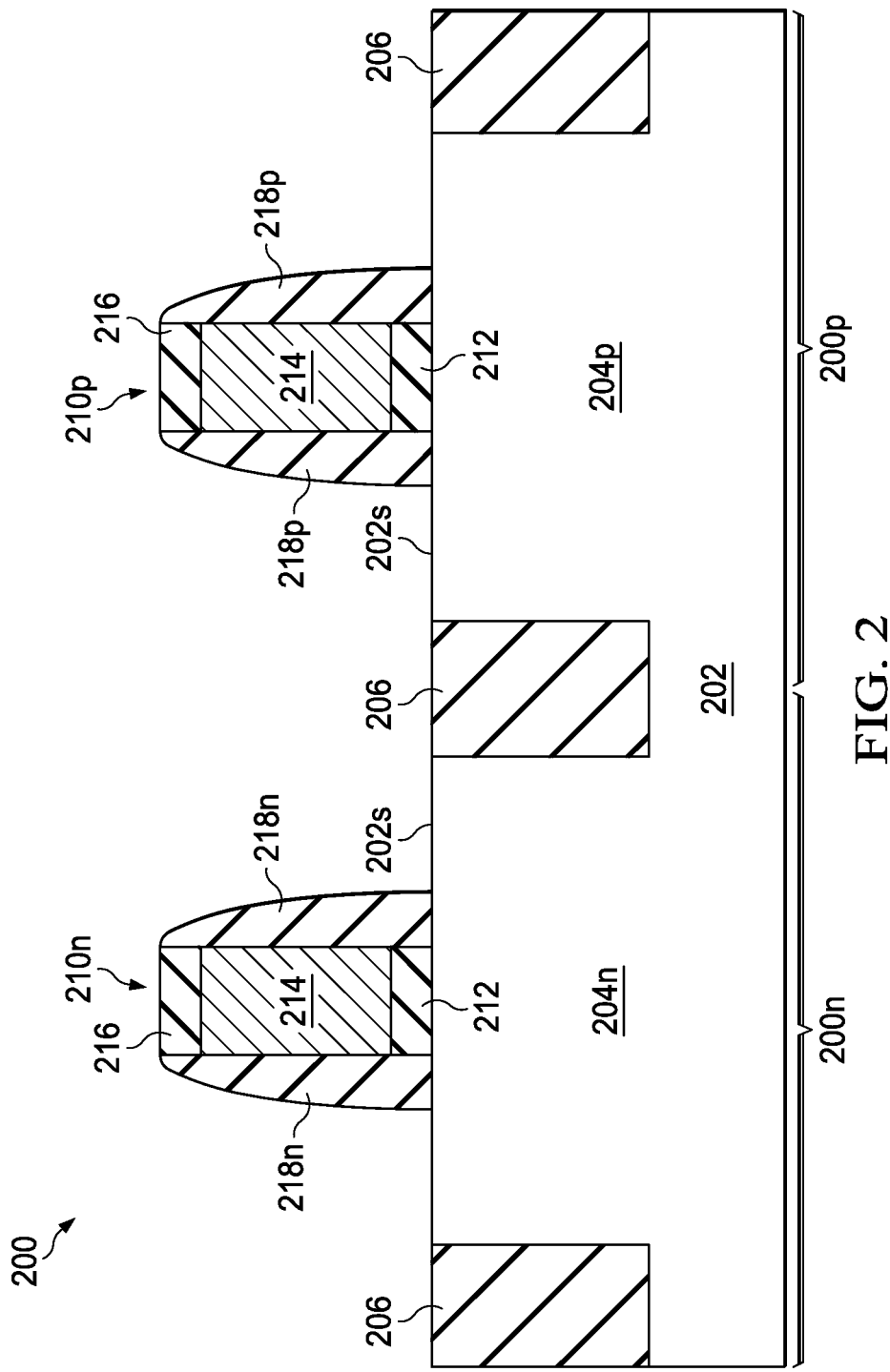
FIGS. 2-12 show schematic cross-sectional views of a semiconductor device comprising a strained structure at various stages of fabrication according to various aspects of the present disclosure.

Referring to FIG. 2 and step 102 in FIG. 1, a substrate 202 is provided. The substrate 202 may comprise a silicon substrate. In some embodiments, the substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure. In the depicted embodiment, the substrate 202 comprises a major surface 202s.

In some embodiments, the semiconductor substrate 202 comprises a P-active region 204p and an N-active region 204n separated by an isolation region 206. The active regions 204p, 204n may include various doping configurations depending on design requirements. For example, the P-active region 204p is doped with n-type dopants, such as phosphorus or arsenic; the N-active region 204n is doped with p-type dopants, such as boron or $BF_2$. As such, the P-active region 204p may be usable for forming a p-type Field Effect Transistor (pFET) 200p, while the N-active region 204n may be usable for forming an n-type Field Effect Transistor (nFET) 200n. Thus, the semiconductor device 200 comprises both the pFET 200p and the nFET 200n.

Isolation regions 206 may be formed on the substrate 202 to isolate the various active regions 204p, 204n from each other. The isolation regions 206 may utilize isolation technology, such as local oxidation of silicon (LOCOS) or shallow trench isolation (STI), to define and electrically isolate the various active regions 204p, 204n. In the present embodiment, the isolation regions 206 comprise an STI. The isolation regions 206 may comprise materials such as silicon oxide, silicon nitride, silicon oxynitride, fluoride-doped silicate glass (FSG), a low-k dielectric material, and/or combinations thereof. The isolation regions 206, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, a P-gate stack 210p is formed over one portion of the major surface 202s (i.e. channel portion of the P-active region 204p), while an N-gate stack 210n is formed over another portion of the major surface 202s (i.e., channel portion of the N-active region 204n). In some embodiments, each of the P-gate stack 210p and the N-gate stack 210n comprises a gate dielectric layer 212 and a gate electrode layer 214 over the gate dielectric layer 212. The P-gate stacks 210p and the N-gate stacks 210n may be formed using any suitable process, including the processes described herein.

In one example, the gate dielectric layer 212 and gate electrode layer 214 are sequentially deposited over the substrate 202. In some embodiments, the gate dielectric layer 212 may include silicon oxide, silicon nitride, silicon oxy-nitride, or high-k dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 212 is a high-k dielectric layer with a thickness in the range of about 10 to 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the substrate 202. The interfacial layer may comprise silicon oxide.

In some embodiments, the gate electrode layer 214 may comprise a single layer or multilayer structure. In the present embodiment, the gate electrode layer 214 may comprise poly-silicon. Further, the gate electrode layer 214 may be doped poly-silicon with uniform or non-uniform doping. In some embodiments, the gate electrode layer 214 may include an N-work-function metal for the N-gate stack 210n. The N-work-function metal comprises Ti, Ag, Al, TiAl, TiAlN, TaC, TaCN, TaSiN, Mn, or Zr. In some embodiments, the gate electrode layer 214 may include a P-work-function metal for the P-gate stack 210p. The P-work-function metal comprises TiN, WN, TaN, and Ru. In the present embodiment, the gate electrode layer 214 comprises a thickness in the range of about 30 nm to about 60 nm. The gate electrode layer 214 may be formed using a suitable process such as ALD, CVD, PVD, plating, or combinations thereof.

Then, a layer of photoresist (not shown) is formed over the gate electrode layer 214 by a suitable process, such as spin-on coating, and patterned to form a patterned photoresist feature by a proper lithography patterning method. In at least one embodiment, a width of the patterned photoresist feature is in the range of about 5 to 45 nm. The patterned photoresist feature can then be transferred using a dry etching process to the underlying layers (i.e., the gate electrode layer 214 and the gate dielectric layer 212) to form the P-gate stack 210p and the N-gate stacks 210n. The photoresist layer may be stripped thereafter.

In another example, a hard mask layer 216 is formed over the gate electrode layer 214; a patterned photoresist layer (not shown) is formed on the hard mask layer 216; and the pattern of the photoresist layer is transferred to the hard mask layer 216 and then transferred to the gate electrode layer 214 and the gate dielectric layer 212 to form the P-gate stack 210p and the N-gate stack 210n. The hard mask layer 216 comprises silicon oxide. In some alternative embodiments, the hard mask layer 216 may comprise silicon nitride, silicon oxynitride, and/or other suitable dielectric materials, and may be formed using a method such as CVD or PVD. The hard mask layer 216 has a thickness in the range from about 100 to 800 angstroms. The photoresist layer may be stripped thereafter.

Still referring to FIG. 2, the semiconductor device 200 further comprises a pair of sidewall spacers 218p on two sides of the P-gate stack 210p and a pair of sidewall spacers 218n on two sides of the N-gate stack 210n. In some embodiments, the sidewall spacers 218p, 218n are formed by first forming a dielectric layer formed over the P-gate stack 210p, the N-gate stacks 210n, and the substrate 202 and covering sidewalls of the P-gate stack 210p and sidewalls of the N-gate stack 210n. The dielectric layer may include silicon oxide, silicon nitride, silicon oxy-nitride, or other suitable material. The dielectric layer may comprise a single layer or multilayer structure. The dielectric layer may be formed by CVD, PVD, ALD, or other suitable technique. The dielectric layer has a thickness ranging from about 5 to 15 nm. Then, an anisotropic etching is performed on the dielectric layer to form the pair of sidewall spacers 218p on two sides of the P-gate stack 210p and the pair of sidewall spacers 218n on two sides of the N-gate stack 210n.

The process steps up to this point have provided the substrate 202 having the P-gate stack 210p over channel portion of the P-active region 204p and the N-gate stack 210n over channel portion of the N-active region 204n. Conventionally, portions of the N-active region (other than where the N-gate stack 210n and the pair of sidewall spacers 218n are formed thereover) are recessed to form N-source and drain (S/D) cavities in the N-active region 204n. Then an N-strained material is epi-grown in the N-SD cavities to form N-S/D regions to strain or stress the channel region of the nFET 200n to enhance carrier mobility of the nFET 200n. Further, portions of the P-active region 204p (other than where the P-gate stack 210p and the pair of sidewall spacers 218p are formed thereover) are recessed to form P-source and drain (S/D) cavities in the P-active region 204p. Then a P-strained material is epi-grown in the P-S/D cavities to form P-S/D regions to strain or stress the channel region of the pFET 200p to enhance carrier mobility of the pFET 200p. However, the strained material (i.e., the N-strained material or P-strained material) may not deliver a given amount of strain into channel region of the semiconductor device, resulting in an insufficient on-current of the semiconductor device.

Accordingly, the processing discussed below with reference to FIGS. 3-12 may fabricate a strained structure in the S/D regions of the semiconductor device, thereby delivering a given amount of strain into channel region of the semiconductor device. Problems associated with insufficient on-current of a semiconductor device may be avoided, thereby enhancing the device performance.

Figure 3:
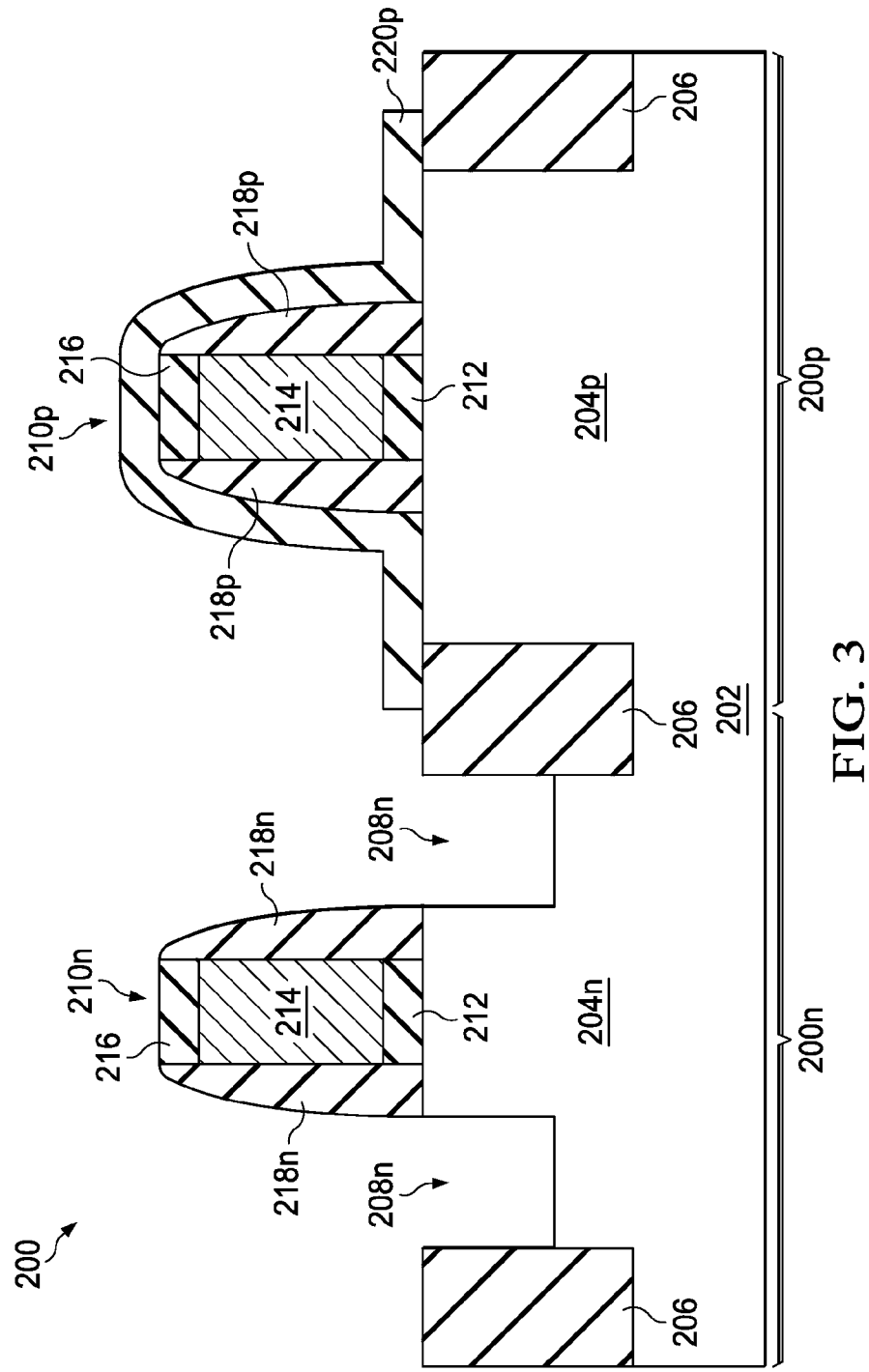

For fabricating one embodiment of the strained structure 250 (shown in FIG. 12) of the semiconductor device 200, the structure in FIG. 3 is produced by recessing portions of the N-active region 204n (other than where the N-gate stack 210n and the pair of sidewall spacers 218n are formed thereover) to form N-source and drain (S/D) cavities 208n in the N-active region 204n (step 104 in FIG. 1). Each of the N-S/D cavities 208n is below the major surface 202s and adjacent to one side of the N-gate stack 210n.

In the depicted embodiment, a dummy dielectric layer comprising a material such as silicon oxide is formed over the substrate 202 by a CVD process, and patterned to form a dummy dielectric feature 220p by proper lithography and etch methods. The dummy dielectric feature 220p covers the P-active region 204p and exposes portions of the N-active region 204n (other than where the N-gate stack 210n and the pair of sidewall spacers 218n are formed thereover). Then, using the dummy dielectric feature 220p and the pair of sidewall spacers 218n as hard masks, a biased etching process is performed to recess the major surface 208s of the substrate 202 that are unprotected or exposed to form the N-S/D cavities 208n in the N-active region 204n. In one embodiment, the etching process may be performed using a chemical selected from $NF_3$, $CF_4$, and $SF_6$ as an etching gas. In an alternative embodiment, the etching process may be performed using a solution comprising $NH_4OH$ and $H_2O_2$.

Figure 4:
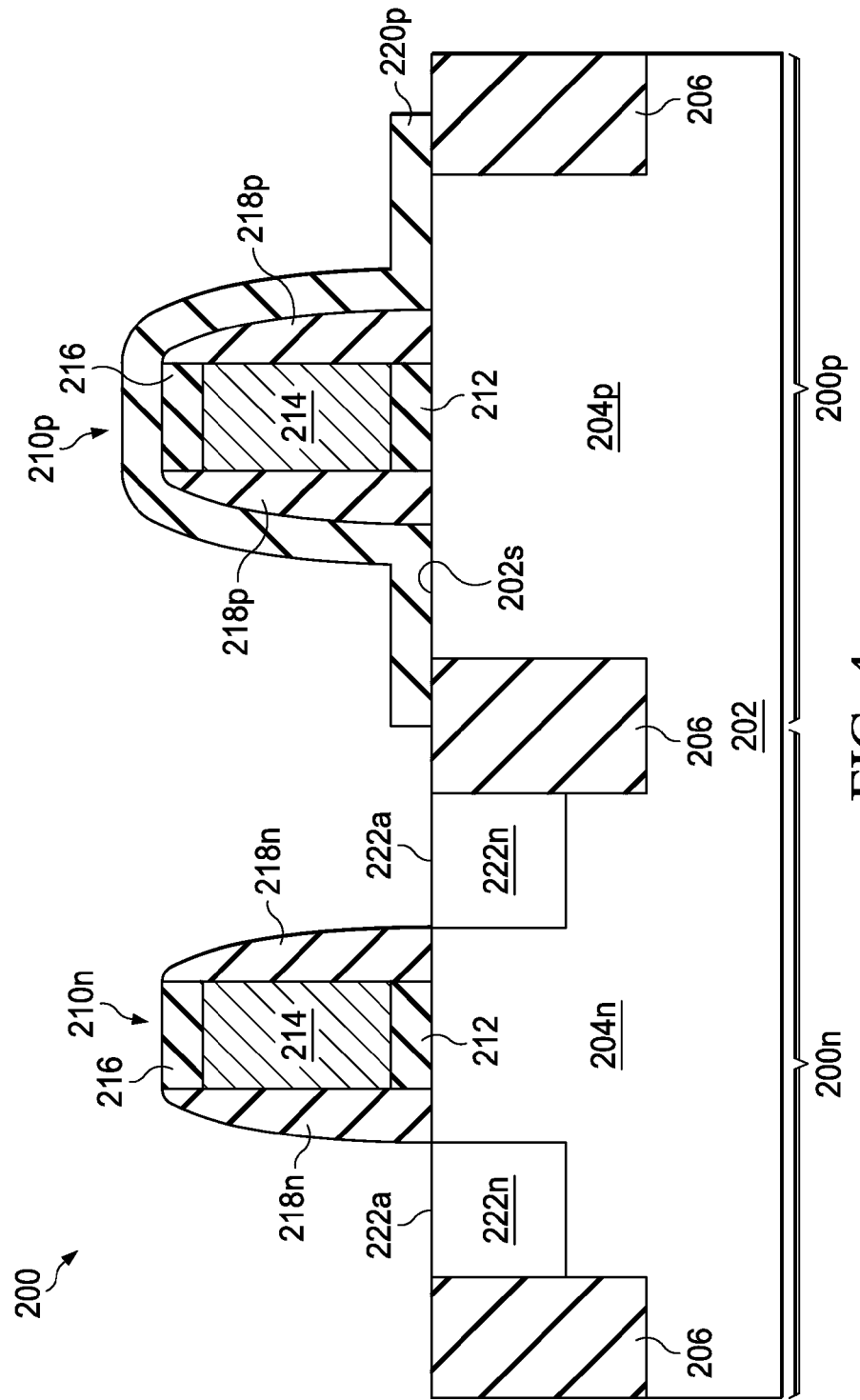

Referring to FIG. 4 and step 106 in FIG. 1, subsequent to the formation of the N-S/D cavities 208n in the N-active region 204n, the structure in FIG. 4 is produced by epi-growing an N-strained material 222n in the N-S/D cavities 208n, wherein a lattice constant of the N-strained material 222n is different from a lattice constant of the substrate 202. In the depicted embodiment, a top surface 222a of the N-strained material 222n is coplanar with the major surface 202s, although it may be higher or lower than the major surface 202s. In some embodiments, the N-strained material 222n comprises SiCP or SiP.

In the depicted embodiment, a pre-cleaning process may be performed to clean the N-S/D cavities 208n with HF or other suitable solution. Then, the N-strained material 222n such as SiCP is selectively grown by an LPCVD process to fill the N-S/D cavities 208n. In the depicted embodiment, the LPCVD process is performed at a temperature of about 400 to 800° C. and under a pressure of about 1 to 15 Torr, using $SiH_4$, $CH_4$, and $H_2$ as reaction gases. Then the dummy dielectric feature 220p is removed using HF solution.

Figure 5:
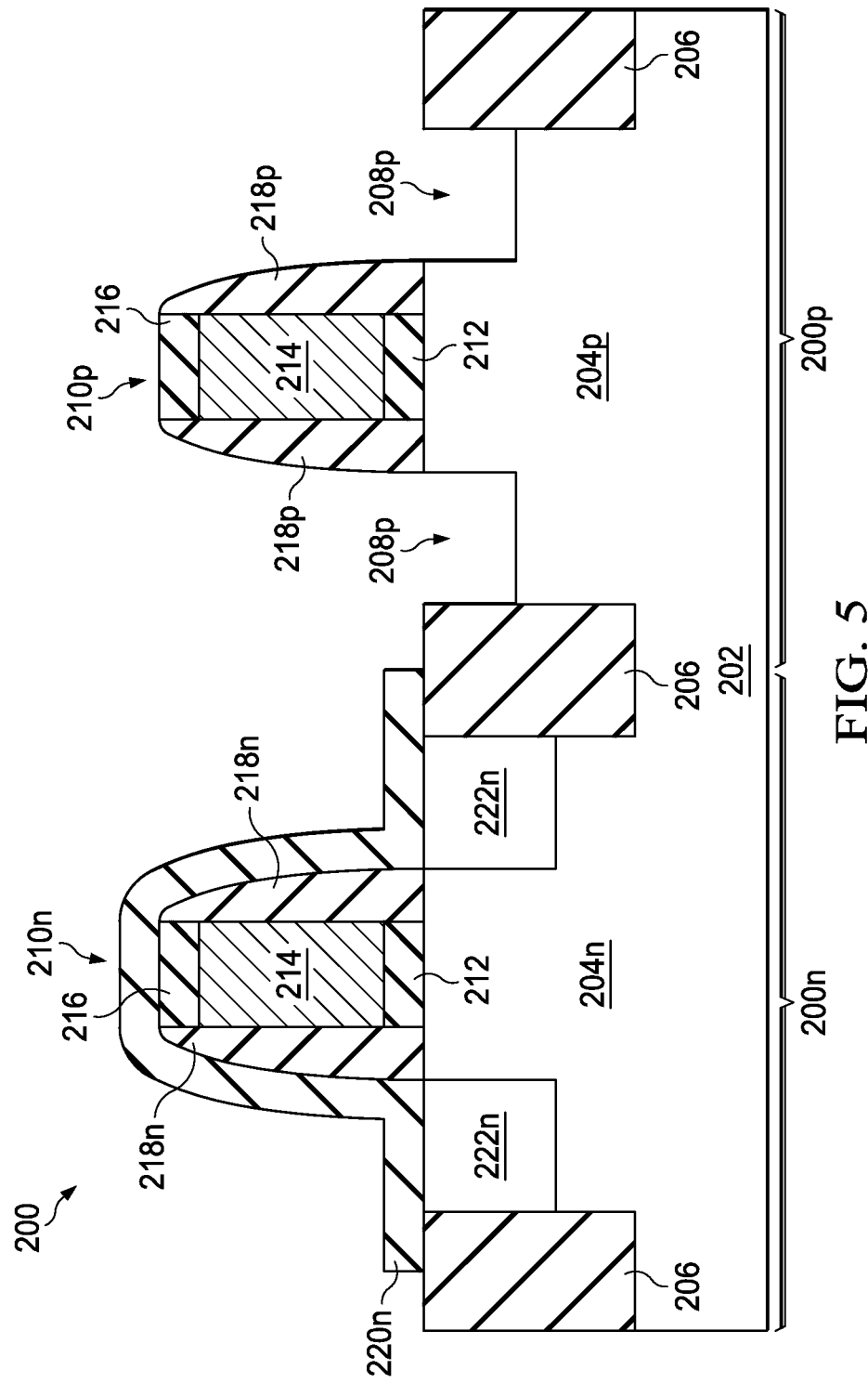

Referring to FIG. 5 and step 104 in FIG. 1, after the formation of the N-strained material 222n in the N-S/D cavities 208n, portions of the P-active region 204p (other than where the P-gate stack 210p and the pair of sidewall spacers 218p are formed thereover) are recessed to form P-source and drain (S/D) cavities 208p in the P-active region 204p. Each of the P-S/D cavities 208p is below the major surface 202s and adjacent to one side of the P-gate stack 210p.

In the depicted embodiment, a dummy dielectric layer such as silicon oxide is formed over the substrate 202 by a CVD process, and patterned to form a dummy dielectric feature 220n by proper lithography and etch methods. The dummy dielectric feature 220n covers the N-active region 204n and exposes portions of the P-active region 204p (other than where the P-gate stack 210p and the pair of sidewall spacers 218p are formed thereover). Then, using the dummy dielectric feature 220n and the pair of sidewall spacers 218p as hard masks, a biased etching process is performed to recess the major surface 202s of the substrate 202 that are unprotected or exposed to form the P-S/D cavities 208p. In at least one embodiment, the etching process may be performed using a chemical selected from $NF_3$, $CF_4$, and $SF_6$ as an etching gas. In an alternative embodiment, the etching process may be performed using a solution comprising $NH_4OH$ and/or $H_2O_2$.

Figure 6:
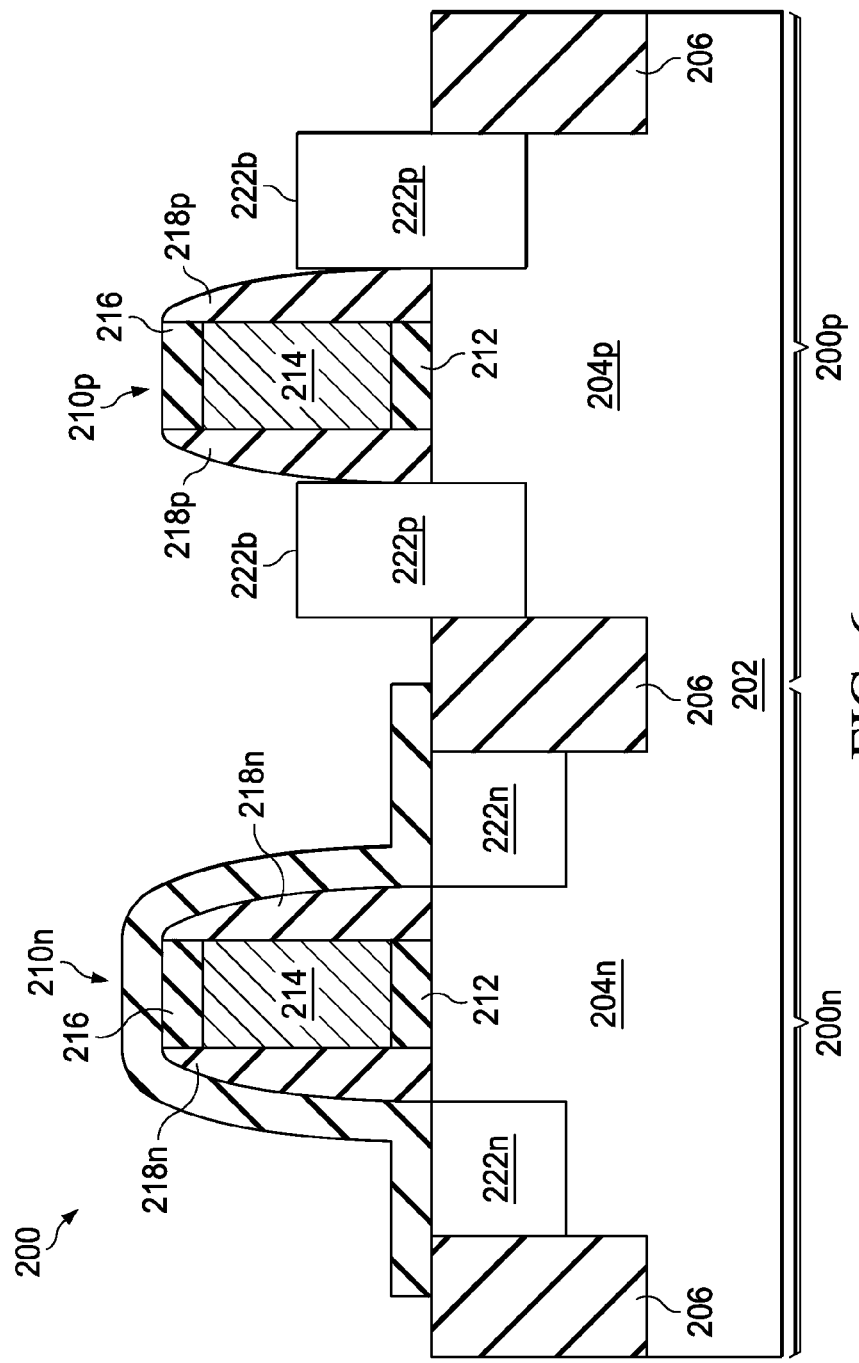

Referring to FIG. 6 and step 106 in FIG. 1, after the formation of the P-S/D cavities 208p in the P-active region 204p, the structure in FIG. 6 is produced by epi-growing a P-strained material 222p in the P-S/D cavities 208p, wherein a lattice constant of the P-strained material 222p is different from a lattice constant of the substrate 202. In the depicted embodiment, a top surface 222b of the P-strained material 222p is higher than the major surface 202s. In some embodiments, the P-strained material 222p comprises SiGe or SiGeB.

In the depicted embodiment, a pre-cleaning process may be performed to clean the P-S/D cavities 208p with HF or other suitable solution. Then, the P-strained material 222p such as silicon germanium (SiGe) is selectively grown by an LPCVD process to fill the P-S/D cavities 208p. In one embodiment, the LPCVD process is performed at a temperature of about 660 to 700° C. and under a pressure of about 13 to 50 Torr, using $SiH_2Cl_2$, HCl, $GeH_4$, $B_2H_6$, and $H_2$ as reaction gases. Then the dummy dielectric feature 220n is removed using HF solution.

Figure 7:
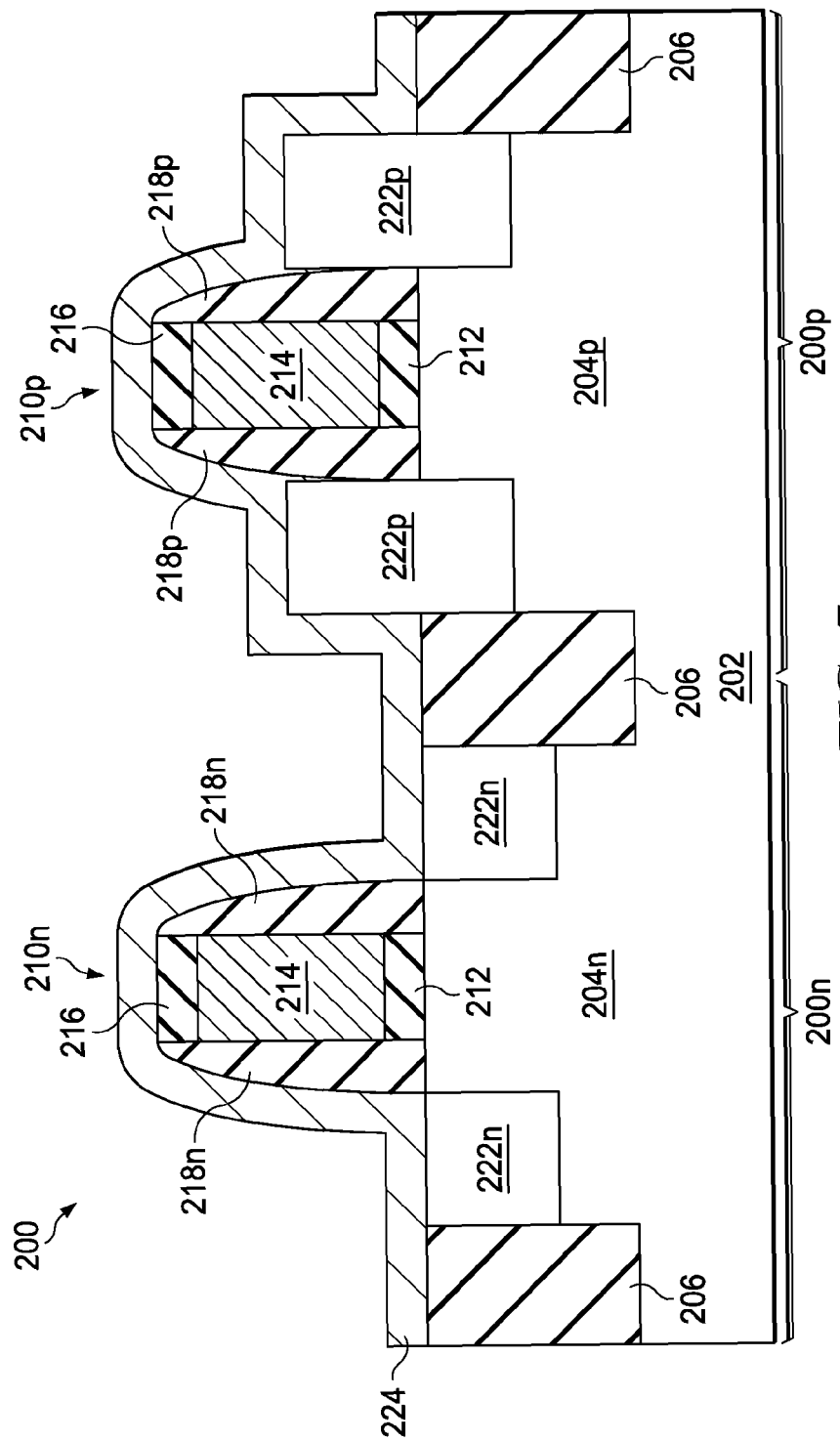

Referring to FIG. 7 and step 108 in FIG. 1, subsequent to the formation of the strained materials 222 (i.e., the P-strained material 222p and the N-strained material 222n), a first metal layer 224 is formed over the strained materials 222 to a thickness of between about 15 and 60 angstroms. In the depicted embodiment, the first metal layer 224 comprises titanium, cobalt, nickel, platinum, erbium, or palladium. The first metal layer 224 may be formed by CVD, PVD, plating, ALD, or other suitable technique.

Figure 8:
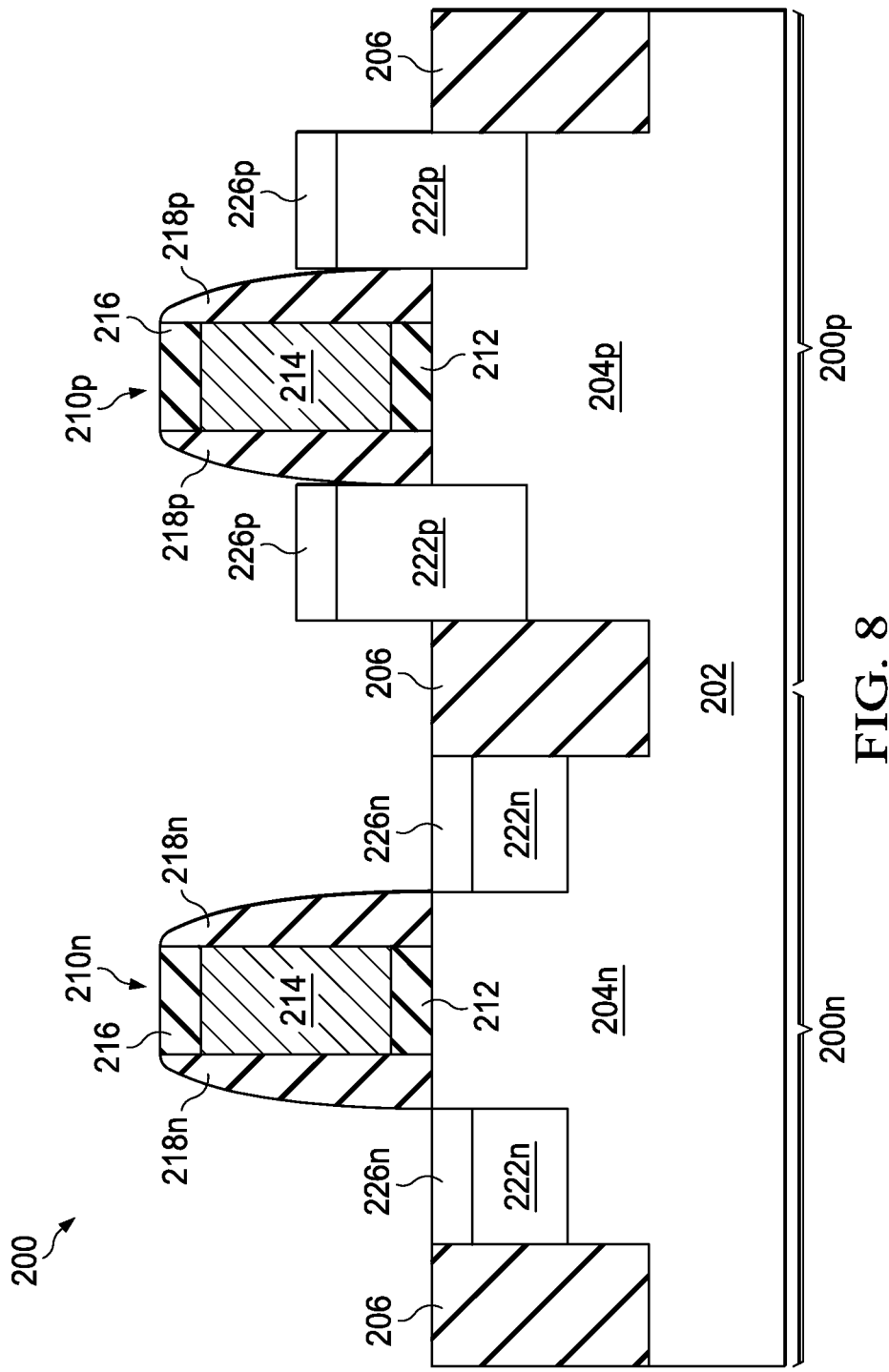

Then, the structure depicted in FIG. 8 is produced by heating the first metal layer 224 and the strained materials 222 to form first silicide regions 226 (step 110 in FIG. 1). In other words, the first metal layer 224 in contact with the strained materials 222 is then transformed into the first silicide regions 226 by a thermal process, such as a rapid thermal anneal (RTA) process. In the depicted embodiment, the first silicide regions 226 comprise first N-silicide regions 226n and first P-silicide regions 226p. In some embodiments, the first silicide regions 226 comprise titanium silicide, cobalt silicide, nickel silicide, platinum silicide, erbium silicide, palladium silicide, and combinations thereof.

In the depicted embodiment, a first RTA process is applied to heat the substrate 202 at a temperature of about 230° C. to 260° C. The first metal layer 224 in contact with the strained materials 222 will form a high-resistance silicide. Then, the remaining un-reacted first metal layer 224 is removed using, for example, a solution comprising NH$_4$OH, H$_2$O$_2$, and deionized water. In order to transform the high-resistance silicide to a low-resistance silicide, a second RTA process is applied to heat the substrate 202 at a temperature of about 650° C. to 750° C., thereby forming the first silicide regions 226.

Figure 9:
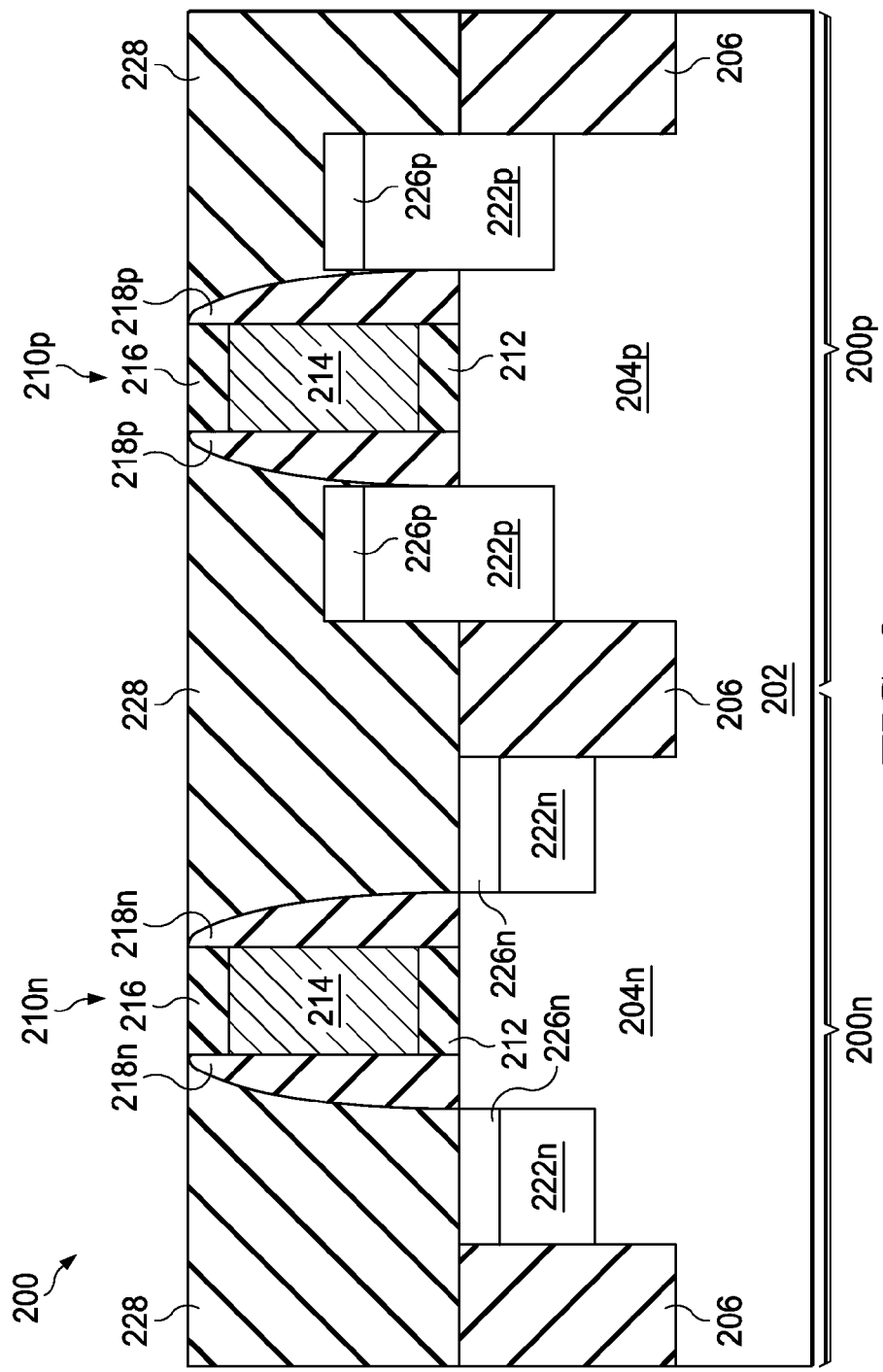

Referring to FIG. 9 and step 112 in FIG. 1, after the formation of the first silicide regions 226, the structure in FIG. 9 is produced by forming an interlayer dielectric (ILD) layer 228 over the first silicide regions 226 and extending over the substrate 202. In some embodiments, the ILD layer 228 may comprise a dielectric material. The dielectric material may comprise silicon oxide, silicon nitride, silicon oxynitride, or a low-k material. It is understood that the ILD layer 228 may comprise one or more dielectric materials and/or one or more dielectric layers. In some embodiments, the ILD layer 228 may be deposited over the first silicide region 226 to a suitable thickness by CVD, high density plasma (HDP) CVD, sub-atmospheric CVD (SACVD), spin-on, sputtering, or other suitable methods. In the present embodiment, the ILD layer 228 has a thickness of about 3000 to 4500 Å. Then, the ILD layer 228 is planarized using a chemical mechanical polishing (CMP) process until a top surface of the hard mask (i.e., the sidewall spacer) 218 is exposed or reached.

Figure 10:
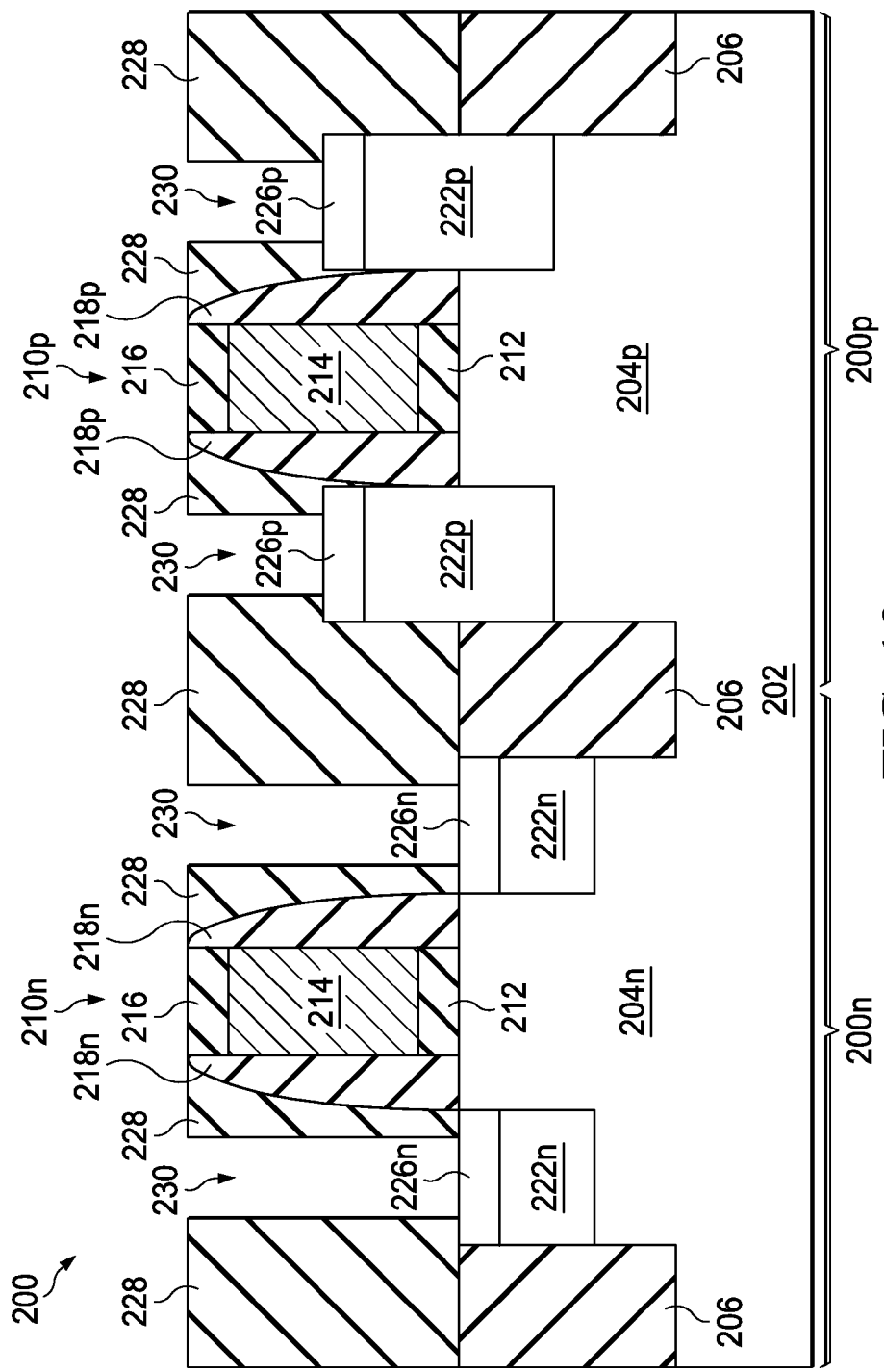

Subsequent CMOS processing steps applied to the semiconductor device 200 of FIG. 9 comprise forming openings 230 in the ILD layer 228, wherein the openings 230 are on the first silicide regions 226 (step 114 in FIG. 1). Referring to FIG. 10, the openings 230 may be formed by any suitable process. As one example, the formation of the openings 230 may comprise patterning the ILD layer 228 by a conventional photolithography process, and etching the exposed ILD layer 228 (for example, by using a dry etching, wet etching, and/or plasma etching process) to remove portions of the ILD layer 228 over portions of the first silicide regions 226 to expose top portions of the first silicide regions 226.

Figure 11:
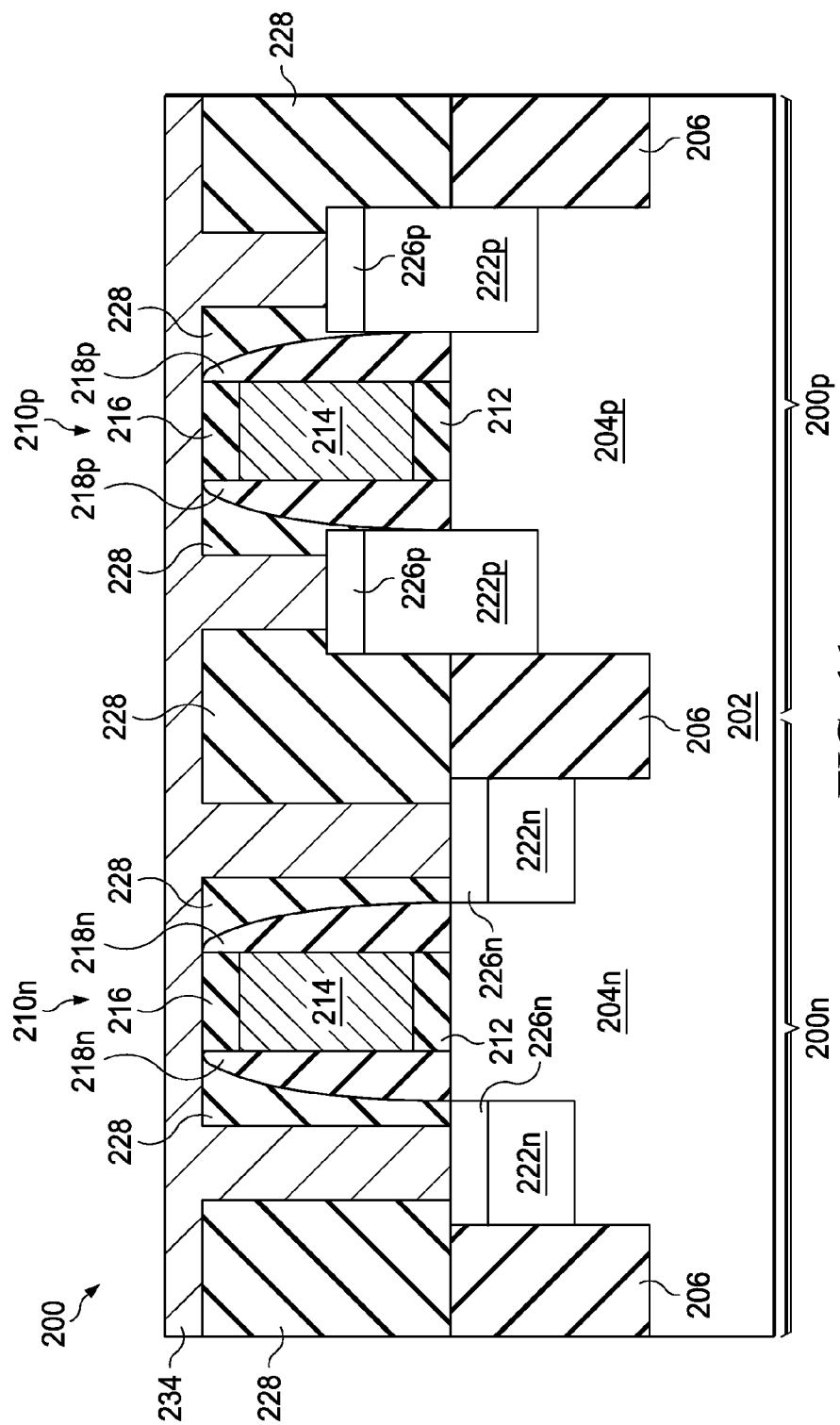

Referring to FIG. 11 and step 116 in FIG. 1, subsequent to the formation of the openings 230 in the ILD layer 228, a second metal layer 234 is formed on the first silicide regions 226 in the openings 230 to a thickness of between about 15 and 60 angstroms. In the depicted embodiment, the second metal layer 234 comprises titanium, cobalt, nickel, platinum, erbium, and palladium. The second metal layer 234 may be formed by CVD, PVD, plating, ALD, or other suitable technique. Although second metal layer 234 is shown as over-filling openings 230, it is not necessary that second metal layer 234 over-fill the trench or even completely fill the trench, because excess portions of second metal layer 234 are subsequently removed, as described more fully below.

Figure 12:
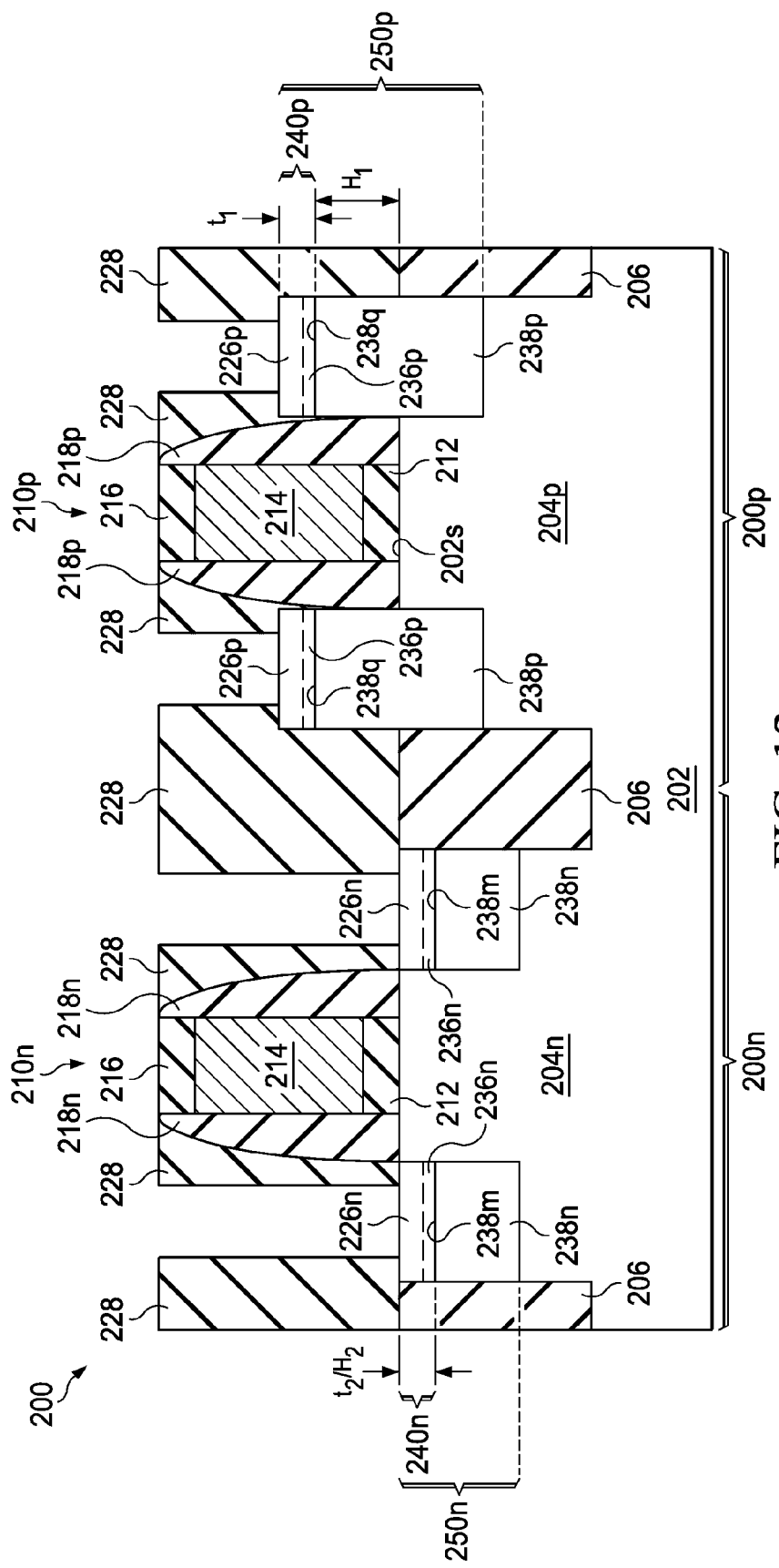

Then, the structure depicted in FIG. 12 is produced by heating the second metal layer 234 and the strained materials 222 to form second silicide regions 236 lower than the first silicide regions 226 (step 118 in FIG. 1). In other words, the second metal layer 234 will penetrate through the first silicide regions 226 to meet the remaining strained material 222, and then will be transformed into the second silicide regions 236 by a thermal process, such as a rapid thermal anneal (RTA) process. In the depicted embodiment, the second silicide regions 236 comprise second N-silicide regions 236n and second P-silicide regions 236p. In some embodiments, the second silicide regions 236 comprise titanium silicide, cobalt silicide, nickel silicide, platinum silicide, erbium silicide, and palladium silicide.

In the depicted embodiment, a third RTA process is applied to heat the substrate 202 at a temperature of about 230° C. to 260° C. The second metal layer 234 meeting the strained material 222 will form a high-resistance silicide. Then, the remaining un-reacted second metal layer 234 is removed using, for example, a solution comprising NH$_4$OH, H$_2$O$_2$, and deionized water. In order to transform the high-resistance silicide to a low-resistance silicide, a fourth RTA process is applied to heat the substrate 202 at a temperature of about 650° C. to 750° C., thereby forming the second silicide regions 236. In the depicted embodiment, the second N-silicide regions 236n are on the remaining N-strained material 222n (referred to as N-strained regions 238n hereafter), while the second P-silicide regions 236p are on the remaining P-strained material 222p (referred to as P-strained regions 238p hereafter).

In some embodiments, the P-strained region 238p has a first top surface 238q higher than the major surface 202s. In some embodiments, a distance H$_1$ between the first top surface 238q and the major surface 202s is in the range of about 5 to 15 nm.

In some embodiments, the N-strained region 238n has a second top surface 238m lower than the major surface 202s. In some embodiments, a distance H$_2$ between the second top surface 238m and the major surface 202s is in the range of about 10 to 25 nm.

In some embodiments, the first N-silicide regions 226n and the second N-silicide regions 236n are combined and referred to as N-silicide regions 240n. As such, a volume of the N-silicide regions 240n is a summation of a volume of the first N-silicide regions 226n and a volume of the second N-silicide regions 236n, which is greater than each of the volume of the first N-silicide regions 226n and the volume of the second N-silicide regions 236n. In some embodiment, a maximum thickness t$_2$ of the N-silicide region 240n is in the range of about 10 to 25 nm. In the depicted embodiment, the N-silicide regions 240n are on the N-strained region 238n. Further, the N-silicide regions 240n are used to strain or stress the channel region of the nFET 200n to enhance carrier mobility of the nFET 200n.

In some embodiments, the first P-silicide regions 226p and the second P-silicide regions 236p are combined and referred to as P-silicide regions 240p. As such, a volume of the P-silicide regions 240p is a summation of a volume of the first P-silicide regions 226p and a volume of the second P-silicide regions 236p, which is greater than each of the volume of the first P-silicide regions 226p and the volume of the second P-silicide regions 236p. In some embodiments, a maximum thickness t$_1$ of the P-silicide region 240p is in the range of about 10 to 25 nm. It should be noted that the P-silicide regions 240p (with similar stress as the N-silicide regions 240n) will degrade carrier mobility of the pFET 200p if the P-silicide regions 240p strain or stress the channel region of the pFET 200p. In the depicted embodiment, the P-silicide regions 240p are on the P-strained regions 238p. Further, the P-silicide regions 240p is used to strain or stress the P-gate stack 210p to enhance work-function of the P-gate stack 210p. Thus, the P-silicide regions 240p are adjacent to the P-gate stack 210p, but far from the channel region of the pFET 200p.

In some embodiments, the P-silicide regions 240p and P-strained regions 238p are combined and referred to as a P-strained structure 250p. In some embodiments, the N-silicide regions 240n and N-strained regions 238n are combined and referred to as an N-strained structure 250n. In some embodiments, the P-strained structure 250p and N-strained structure 250n are combined and referred to as a strained structure 250.

Accordingly, Applicant's method may fabricate large-volume N-silicide regions 240n in the S/D regions of the nFET 200n of the semiconductor device 200, thereby delivering a given amount of strain into channel region of the semiconductor device 200. Further, Applicant's method may fabricate large-volume P-silicide regions 240p in the S/D regions of the pFET 200p of the semiconductor device 200, thereby delivering a given amount of strain into P-gate stack 210p of the semiconductor device 200. Problems associated with insufficient on-current of the semiconductor device 200 may be avoided, thereby enhancing the device performance.

It is understood that the semiconductor device 200 may undergo further CMOS processes to form various features such as contacts/vias, interconnect metal layers, dielectric layers, passivation layers, etc.

In accordance with embodiments, a semiconductor device comprises a substrate comprising a major surface; a p-type Field Effect Transistor (pFET) comprising: a P-gate stack over the major surface, a P-strained region in the substrate adjacent to one side of the P-gate stack, wherein a lattice constant of the P-strained region is different from a lattice constant of the substrate, wherein the P-strained region has a first top surface higher than the major surface; and a P-silicide region on the P-strained region; and an n-type Field Effect Transistor (nFET) comprising: an N-gate stack over the major surface, an N-strained region in the substrate adjacent to one side of the N-gate stack, wherein a lattice constant of the N-strained region is different from a lattice constant of the substrate, wherein the N-strained region has a second top surface lower than the major surface and a N-silicide region on the N-strained region.

In accordance with another embodiments, a method for fabricating a semiconductor device comprises providing a substrate comprising a major surface; forming a cavity below the major surface; epi-growing a strained material in the cavity, wherein a lattice constant of the strained material is different from a lattice constant of the substrate; forming a first metal layer over the strained material; heating the first metal layer and the strained material to form a first silicide region; forming an interlayer dielectric (ILD) layer over the first silicide region and extending over the substrate; forming an opening in the ILD layer, wherein the opening is on the first silicide region; forming a second metal layer on the first silicide region in the opening; and heating the second metal layer and the strained material to form a second silicide region lower than the first silicide region.

In accordance with other embodiments, a method comprises forming a p-type Field Effect Transistor (pFET) on a major surface of a substrate. This includes forming a P-gate stack over the major surface, epitaxially growing a P-strained region in the substrate adjacent to one side of the P-gate stack and extending above the major surface, wherein a lattice constant of the P-strained region is different from a lattice constant of the substrate, forming a first P-silicide region on the P-strained region, and forming a second P-silicide region on the P-strained region after forming the first P-silicide region, the second P-silicide region being formed under the first P-silicide region. The method further comprises forming an n-type Field Effect Transistor (nFET). This includes forming an N-gate stack over the major surface, epitaxially growing an N-strained region in the substrate adjacent to one side of the N-gate stack and having a top surface below the major surface of the substrate, wherein a lattice constant of the N-strained region is different from the lattice constant of the substrate and different form the lattice constant of the P-strained region, forming a first N-silicide region on the P-strained region, and forming a second N-silicide region on the N-strained region after forming the first N-silicide region, the second N-silicide region being formed under the first N-silicide region.

In accordance with yet other embodiments, a method comprises forming a strained P-region adjacent a P-channel region and a strained N-region adjacent an N-channel region and depositing a first metal layer on the strained P-region and the strained N-region simultaneously. The first metal layer is reacted with the strained P-region and the strained N-region to form a first P-silicide and a first N-silicide simultaneously. The method further comprises depositing a second metal layer on the first P-silicide and the first N-silicide simultaneously, and reacting the second layer with the first P-silicide and the first N-silicide simultaneously, wherein the first and second N-silicide regions impart greater strain on the N-channel region than strain imparted on the P-channel region by the first and second P-silicide regions.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method comprising:
   forming a p-type Field Effect Transistor (pFET) on a major surface of a substrate, including:
      forming a P-gate stack over a P-channel region of the major surface,
      epitaxially growing a P-strained region in the substrate adjacent to one side of the P-gate stack and extending above the major surface, wherein a lattice constant of the P-strained region is different from a lattice constant of the substrate, forming a first P-silicide region on the P-strained region, and
      forming a second P-silicide region on the P-strained region after forming the first P-silicide region, the second P-silicide region being formed under the first P-silicide region, wherein the first and second P-silicide regions are collectively a first distance from the P-channel region and collectively impart a first strain on the P-channel region;
   forming an n-type Field Effect Transistor (nFET) including:
      forming an N-gate stack over a N-channel region of the major surface,
      epitaxially growing an N-strained region in the substrate adjacent to one side of the N-gate stack and having a top surface below the top surface of the P-strained region, wherein a lattice constant of the N-strained region is different from the lattice constant of the substrate and different from the lattice constant of the P-strained region, and
      forming a first N-silicide region on the N-strained region, and forming a second N-silicide region on the N-strained region after forming the first N-silicide region, the second N-silicide region being formed under the first N-silicide region, wherein the first and second N-silicide regions are collectively a second distance from the N-channel region and collectively impart a second strain on the N-channel region, the second distance being less than the first distance and the second strain being greater than the first strain by virtue of the second distance being less than the first distance.

2. The method of claim 1, further comprising:
depositing a first metal layer over the P-strained region and the N-strained region;
reacting at least some of the first metal layer with the P-strained region and with the N-strained region to form a first P-silicide region and a first N-silicide region, respectively;
removing unreacted first metal layer;
depositing an dielectric layer over the first P-silicide region and the first N-silicide region;
patterning the dielectric layer to expose at least a portion of the first P-silicide region and least a portion of the first N-silicide region;
depositing a second metal layer on the exposed portion of first P-silicide region and the exposed portion of the first N-silicide region;
reacting at least some of the second metal layer with the P-strained region and with the N-strained region to form a second P-silicide region and a second N-silicide region, respectively; and
removing unreacted second metal layer.

3. The method of claim 2, wherein the step of reacting at least some of the first metal layer with the P-strained region and with the N-strained region comprises performing a rapid thermal anneal process.

4. The method of claim 3, further comprising performing a second rapid thermal anneal process to convert the first P-silicide region and the first N-silicide region, respectively, from a high resistance state to a low resistance state.

5. The method of claim 1, wherein the first N-silicide region and the second N-silicide region impart a tensile strain on an N-channel region of the substrate.

6. The method of claim 2, wherein the second metal layer penetrates through the first P-silicide region and the first N-silicide region, respectively, to react with the P-strained region and the N-strained region, respectively, to form the second P-silicide region and the second N-silicide region, respectively.

7. The method of claim 2, wherein the step of removing unreacted first metal layer comprises exposing the unreacted first metal layer to a solution of NH4OH, H2O2, and deionized water.

8. A method comprising:
forming a strained P-region adjacent a P-channel region of a substrate and a strained N-region adjacent an N-channel region of the substrate, the strained P-region extending above a top surface of the substrate and the strained N-region being co-planar with the top surface of the substrate;
depositing a first metal layer on the strained P-region and the strained N-region simultaneously;
reacting the first metal layer with the strained P-region and the strained N-region to form a first P-silicide region and a first N-silicide region simultaneously;
depositing a second metal layer on the first P-silicide region and the first N-silicide region simultaneously; and
reacting the second metal layer with the strained P-region and the strained N-region to form a second P-silicide region and a second N-silicide region simultaneously, wherein the first and second N-silicide regions impart greater strain on the N-channel region than strain imparted on the P-channel region by the first and second P-silicide regions by virtue of the first and second N-silicide regions being closer to the N-channel region than the first and second P-silicide regions are to the P-channel region.

9. The method of claim 8, further comprising removing unreacted first metal layer after forming the first P-silicide region and the first N-silicide region, and removing unreacted second metal layer after forming the second P-silicide region and the second N-silicide region.

10. The method of claim 8, further comprising performing a thermal anneal on the second metal layer and the strained P-region and N-strained region, such that the second metal layer penetrates the first P-Silicide region and the first N-silicide region, respectively, to react with the strained P-region and strained N-region, respectively.

11. The method of claim 8, wherein the step of forming a strained P-region adjacent a P-channel region and a strained N-region adjacent an N-channel region comprises epitaxially growing a first material having a first lattice constant to have a top surface above a top surface of a substrate in which the strained P-region is formed, and epitaxially growing a second material having a second lattice constant different than the first lattice constant to have a top surface below the top surface of the substrate.

12. A method comprising:
forming a p-type Field Effect Transistor (pFET) on a major surface of a substrate, including:
forming a P-gate stack over a P-channel region of the major surface,
etching a recess into the major surface adjacent to one side of the P-gate stack;
epitaxially growing a P-strained region in the recess and extending above the major surface, wherein a lattice constant of the P-strained region is different from a lattice constant of the substrate,
forming a first P-silicide region on the P-strained region, and
forming a second P-silicide region on the P-strained region after forming the first P-silicide region, the second P-silicide region extending under the first P-silicide region, wherein the first and second P-silicide regions are a first distance from the P-channel region;
forming an n-type Field Effect Transistor (pFET) on the major surface of a substrate, including:
forming a N-gate stack over a N-channel region of the major surface,
etching a recess into the major surface adjacent to one side of the N-gate stack;
epitaxially growing a N-strained region in the recess and extending above the major surface, wherein a lattice constant of the N-strained region is different from a lattice constant of the substrate and the lattice constant of the P-strained region,
forming a first N-silicide region on the N-strained region, and
forming a second N-silicide region on the N-strained region after forming the first N-silicide region, the second N-silicide region extending under the first N-silicide region, wherein the first and second N-silicide regions are a second first distance from the N-channel region, and wherein the first and second N-silicide regions impart greater strain on the N-channel region than strain imparted on the P-channel region by the first and second P-silicide regions by virtue of the first and second N-silicide regions being closer to the N-channel region than the first and second P-silicide regions are to the P-channel region.

13. The method of claim 12, wherein a top surface of the N-strained region is coplanar with the major surface of the substrate.

14. The method of claim 12, further comprising:

depositing a first metal layer over the P-strained region and the N-strained region;

reacting at least some of the first metal layer with the P-strained region and with the N-strained region to form a first P-silicide region and a first N-silicide region, respectively;

removing unreacted first metal layer;

depositing an dielectric layer over the first P-silicide region and the first N-silicide region;

patterning the dielectric layer to expose at least a portion of the first P-silicide region and least a portion of the first N-silicide region;

depositing a second metal layer on the exposed portion of first P-silicide region and the exposed portion of the first N-silicide region;

reacting at least some of the second metal layer with the P-strained region and with the N-strained region to form a second P-silicide region and a second N-silicide region, respectively; and removing unreacted second metal layer.

15. The method of claim 12, wherein the first P-silicide region and the first N-silicide region are formed simultaneously.

16. The method of claim 12, wherein the first P-silicide region and the second P-silicide region are formed on both sides of the P-gate stack.

17. The method of claim 16, the first N-silicide region and the second N-silicide region are formed on both sides of the N-gate stack.

18. The method of claim 14, further comprising removing unreacted first metal layer after forming the first P-silicide region and the first N-silicide region, and removing unreacted second metal layer after forming the second P-silicide region and the second N-silicide region.

19. The method of claim 18, further comprising performing a thermal anneal on the second metal layer and the P-strained region and N-strained region, such that the second metal layer penetrates the first P-Silicide region and the first N-silicide region, respectively, to react with the P-strained region and N-strained region, respectively.

* * * * *

UNITED STATES PATENT AND TRADEMARK OFFICE
CERTIFICATE OF CORRECTION

PATENT NO. : 9,236,253 B2  
APPLICATION NO. : 14/166585  
DATED : January 12, 2016  
INVENTOR(S) : Chung-Hsien Chen Page 1 of 1

It is certified that error appears in the above-identified patent and that said Letters Patent is hereby corrected as shown below:

Claims

In Col. 12, line 64, claim 12, delete "first".

Signed and Sealed this
Twelfth Day of April, 2016

Michelle K. Lee
*Director of the United States Patent and Trademark Office*